(12) United States Patent
Marrotte

(10) Patent No.: US 12,235,802 B2
(45) Date of Patent: *Feb. 25, 2025

(54) SYSTEM AND METHOD FOR A CONTENT-AWARE AND CONTEXT-AWARE COMPRESSION ALGORITHM SELECTION MODEL FOR A FILE SYSTEM

(71) Applicant: EMC IP Holding Company LLC, Hopkinton, MA (US)

(72) Inventor: Michael Marrotte, Windermere, FL (US)

(73) Assignee: EMC IP HOLDING COMPANY LLC, Hopkinton, TX (US)

( * ) Notice: Subject to any disclaimer, the term of this patent is extended or adjusted under 35 U.S.C. 154(b) by 257 days.

This patent is subject to a terminal disclaimer.

(21) Appl. No.: 17/385,744

(22) Filed: Jul. 26, 2021

(65) Prior Publication Data

US 2023/0021513 A1    Jan. 26, 2023

(51) Int. Cl.
*G06F 16/174* (2019.01)
*G06F 16/11* (2019.01)
*G06N 20/00* (2019.01)

(52) U.S. Cl.
CPC .......... *G06F 16/1744* (2019.01); *G06F 16/11* (2019.01); *G06N 20/00* (2019.01)

(58) Field of Classification Search
CPC ...... G06F 16/1744; G06F 16/11; G06N 20/00
USPC .................................................. 707/693
See application file for complete search history.

(56) References Cited

U.S. PATENT DOCUMENTS

| | | | |
|---|---|---|---|
| 11,249,641 B2* | 2/2022 | Viswanath | G06F 3/04842 |
| 2006/0034212 A1* | 2/2006 | Mutch | H03M 7/30 370/328 |
| 2014/0297742 A1* | 10/2014 | Lyren | H04L 65/403 709/204 |
| 2017/0090776 A1* | 3/2017 | Kowles | G06F 3/0685 |
| 2018/0152535 A1* | 5/2018 | Sade | G16B 50/50 |
| 2018/0173473 A1* | 6/2018 | Lankreijer | G06F 9/52 |
| 2021/0344549 A1* | 11/2021 | Babington | H03M 7/6082 |

* cited by examiner

*Primary Examiner* — Sherief Badawi
*Assistant Examiner* — Earl Elias
(74) *Attorney, Agent, or Firm* — Chamberlain, Hrdlicka, White, Williams & Aughtry; Aly Z. Dossa

(57) ABSTRACT

A method for managing a file system includes obtaining, by a compression optimizing manager, a compression algorithm selection request for the file system, determining a set of selection inputs based on a set of file system parameters of the file system, applying a compression selection model to the set of selection inputs to obtain a compression algorithm selection, and initiating a file system compression implementation of the file system using the compression algorithm selection.

17 Claims, 7 Drawing Sheets

SYSTEM AND METHOD FOR A CONTENT-AWARE AND CONTEXT-AWARE COMPRESSION ALGORITHM SELECTION MODEL FOR A FILE SYSTEM

BACKGROUND

Computing devices in a system may include any number of computing resources such as processors, memory, and persistent storage. The storage of large amounts of data may require large amounts of computing resources. The larger the data, the more computing resources required to perform the storage of such data.

SUMMARY

In general, in one aspect, the invention relates to a method for managing data. The method includes obtaining, by a compression optimizing manager, a compression algorithm selection request for the file system, determining a set of selection inputs based on a set of file system parameters of the file system, applying a compression selection model to the set of selection inputs to obtain a compression algorithm selection, and initiating a file system compression implementation of the file system using the compression algorithm selection.

In one aspect, the invention relates to a non-transitory computer readable medium that includes computer readable program code, which when executed by a computer processor enables the computer processor to perform a method for managing data. The method includes obtaining, by a compression optimizing manager, a compression algorithm selection request for the file system, determining a set of selection inputs based on a set of file system parameters of the file system, applying a compression selection model to the set of selection inputs to obtain a compression algorithm selection, and initiating a file system compression implementation of the file system using the compression algorithm selection.

In one aspect, the invention relates to a system that includes a processor and memory that includes instructions, which when executed by the processor, perform a method. The method includes obtaining, by a compression optimizing manager, a compression algorithm selection request for the file system, determining a set of selection inputs based on a set of file system parameters of the file system, applying a compression selection model to the set of selection inputs to obtain a compression algorithm selection, and initiating a file system compression implementation of the file system using the compression algorithm selection.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

DETAILED DESCRIPTION

Figure 1A:
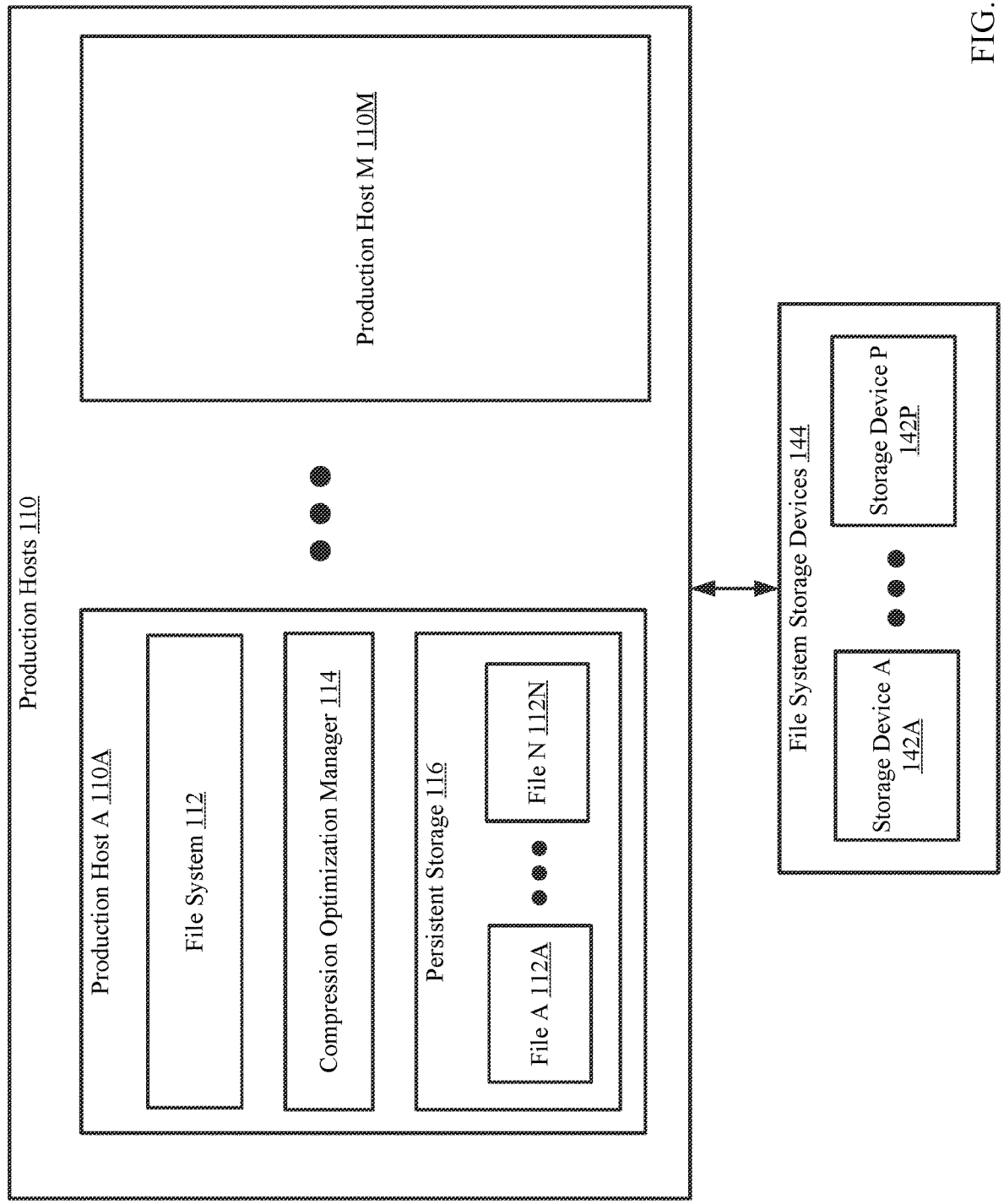
FIG. 1A shows a diagram of a system in accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

In general, embodiments of the invention relate to a method and system for managing file systems managed by production hosts. Specifically, embodiments of the invention include a method for performing a machine learning algorithm on a large set of compression algorithms that may be performed on the file systems. The result of the machine learning algorithm is a compression selection model. The compression selection model may take as inputs: (i) any attributes associated with a file system to be compressed and (ii) a set of production host performance objectives that specify which performance metrics are more important to the production host environment when performing the compression. The attributes may include content-aware inputs. The content-aware inputs may correspond to the content of the files of the file system (e.g., file extension, file size, number of files in the file system, etc.). Further the attributes may include context-aware inputs. The context-aware inputs includes inputs that specify the context in which the file system is produced. Examples of context-aware inputs include, but are not limited to: the file system protocol of the file system, the location of a production host hosting the file system, and the type of backup storage in which the storage device is stored. The compression selection model may be used, in conjunction with the aforementioned inputs, to select an optimal compression algorithm to be performed on the file system. Embodiments of the invention may further relate to initiating the compression and storage of the file system based on the selected compression algorithm.

FIG. 1A shows a diagram of a system in accordance with one or more embodiments of the invention. The system includes one or more production hosts (110) and a file system storage devices (144). The system may include additional, fewer, and/or different components without departing from the invention. Each component may be operably connected to any of the other components via any combination of wired and/or wireless connections. Each component illustrated in FIG. 1A is discussed below.

In one or more embodiments of the invention, the production hosts (110) host file systems (112). The file system (112) is an application that manages the storage, access of files (112A, 112N) stored in persistent storage (e.g., 116). Each file (112A, 112N) may be accessed via a directory. The directory may specify a file path for each file (112A, 112N) in the file system (112). The file system (112) (and/or the files (112A, 112N) managed by the file system (112)), may be compressed by a lossless or lossy compression algorithm as implemented by the compression optimization manager (114) of the respective production host (110A, 110M). The compressed file system data may be stored in persistent storage (116) of the production host (110A, 110M).

As used herein, a lossless compression algorithm refers to an algorithm that encodes portions of data objects (e.g., a file (112A, 112N)) and/or portions of the file system (112) wherein the encoded portions take up less data than the original portions for the purpose of reducing the total amount of data used by the file. In contrast to a lossy compression algorithm, the data objects that have undergone lossless compression may be restored to the original data through decoding the encoded portions without any data loss. Examples of lossless compression algorithms include a Lempel-Ziv-Markov chain algorithm (LZMA), Lempel-Ziv Welch (LZW), free lossless audio codec (FLAC), run-length encoding (RLE), and/or other types of compression without departing from the invention.

In one or more embodiments of the invention, each compression algorithm may include variations based on parameters that impact the compression ratio. By impacting the compression ratio of the compression algorithm, one variation of a compression algorithm may be considered as a separate compression algorithm from a second variation of a first compression algorithm. For example, a LZMA compression algorithm of a first variation may be tuned to have a higher compression ratio than a LZMA compression algorithm of a second variation. Accordingly, the first variation may be considered one compression algorithm, and the second variation may be considered as a second, separate compression algorithm. As used herein, each variation of a compression algorithm may be referred to as a separate compression algorithm without departing from the invention.

In one or more embodiments of the invention, the compression optimizing manager (114) provides compression selection services to the respective production host (110A). Specifically, the compression optimizing manager (100) generates a compression selection model in accordance with FIG. 3A that may be used to select a compression algorithm.

Figure 4:
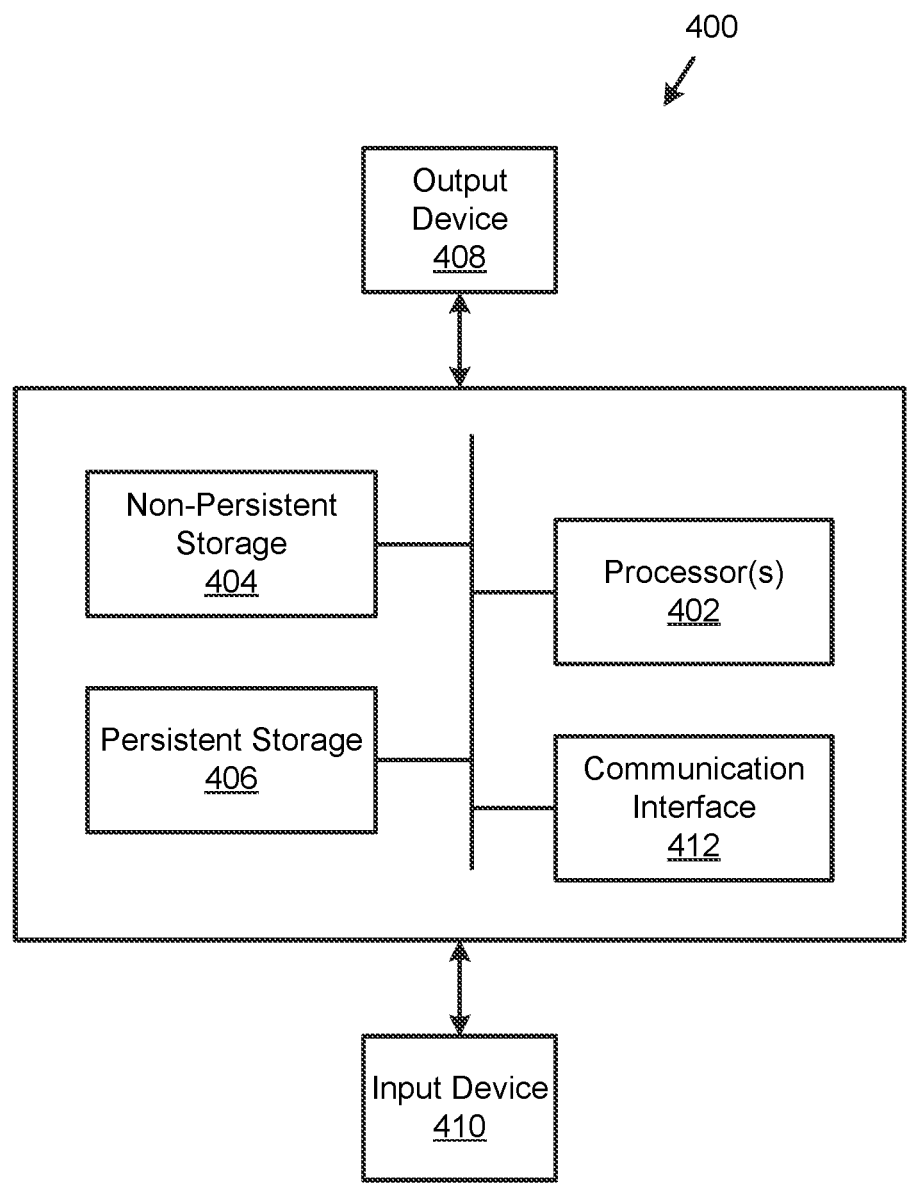
FIG. 4 shows a diagram of a computing device in accordance with one or more embodiments of the invention.

In one or more embodiments of the invention, a compression optimizing manager (114) is implemented as a computing device (see e.g., FIG. 4). The computing device may be, for example, a mobile phone, a tablet computer, a laptop computer, a desktop computer, a server, a distributed computing system, or a cloud resource. The computing device may include one or more processors, memory (e.g., random access memory), and persistent storage (e.g., disk drives, solid state drives, etc.). The computing device may include instructions, stored on the persistent storage, that when executed by the processor(s) of the computing device cause the computing device to perform the functionality of the compression optimizing manager (114) described throughout this application.

In one or more embodiments of the invention, the compression optimizing manager (114) is implemented as a logical device. The logical device may utilize the computing resources of any number of computing devices and thereby provide the functionality of the compression optimizing manager (114) described throughout this application. For additional details regarding the compression optimization manager (114), see, e.g., FIG. 1B.

In one or more embodiments of the invention, each production host (110A, 110M) may be associated with an architecture. An architecture may be a structure in which production hosts operate and communicate with other production hosts of similar architectures. Each production host of a similar architecture may share, for example, a similar operating system, a similar network protocol, and/or include similar computing resources. Collectively, the production hosts (110) may be associated with one or more architectures. Examples of architectures of production hosts include, but are not limited to, cloud services, virtual machine In one or more embodiments of the invention, each of the production hosts (110A, 110N) is implemented as a computing device (see e.g., FIG. 4). The computing device may be, for example, a mobile phone, a tablet computer, a laptop computer, a desktop computer, a server, a distributed computing system, or a cloud resource. The computing device may include one or more processors, memory (e.g., random access memory), and persistent storage (e.g., disk drives, solid state drives, etc.). The computing device may include instructions, stored on the persistent storage, that when executed by the processor(s) of the computing device cause the computing device to perform the functionality of the production host (110A, 110M) described throughout this application.

In one or more embodiments of the invention, each of the production hosts (110A, 110M) is implemented as a logical device. The logical device may utilize the computing resources of any number of computing devices and thereby provide the functionality of the production host (110A, 110M) described throughout this application.

In one or more embodiments of the invention, the file system storage devices (144) store compressed versions of the file system (112). The file system storage devices (144) may communicate with the production hosts (110) when obtaining compressed data to be stored and/or when transferring data to the production hosts (110).

In one or more embodiments of the invention, the file system storage devices (142A, 142P) are implemented as a computing device (see e.g., FIG. 4). The computing device may be, for example, a mobile phone, a tablet computer, a laptop computer, a desktop computer, a server, a distributed computing system, or a cloud resource. The computing device may include one or more processors, memory (e.g., random access memory), and persistent storage (e.g., disk drives, solid state drives, etc.). The computing device may include instructions stored on the persistent storage, that when executed by the processor(s) of the computing device cause the computing device to perform the functionality of the file system storage devices (144) described throughout this application.

In one or more embodiments of the invention, the file system storage devices (144) are each implemented as a logical device. The logical device may utilize the computing resources of any number of computing devices (e.g., of the production hosts (110)) and thereby provide the functionality of the file system storage devices (144) described throughout this application.

While illustrated as a separate component, the file system storage devices (144) may each execute as a component of the production hosts (110) without departing from the invention.

Figure 1B:
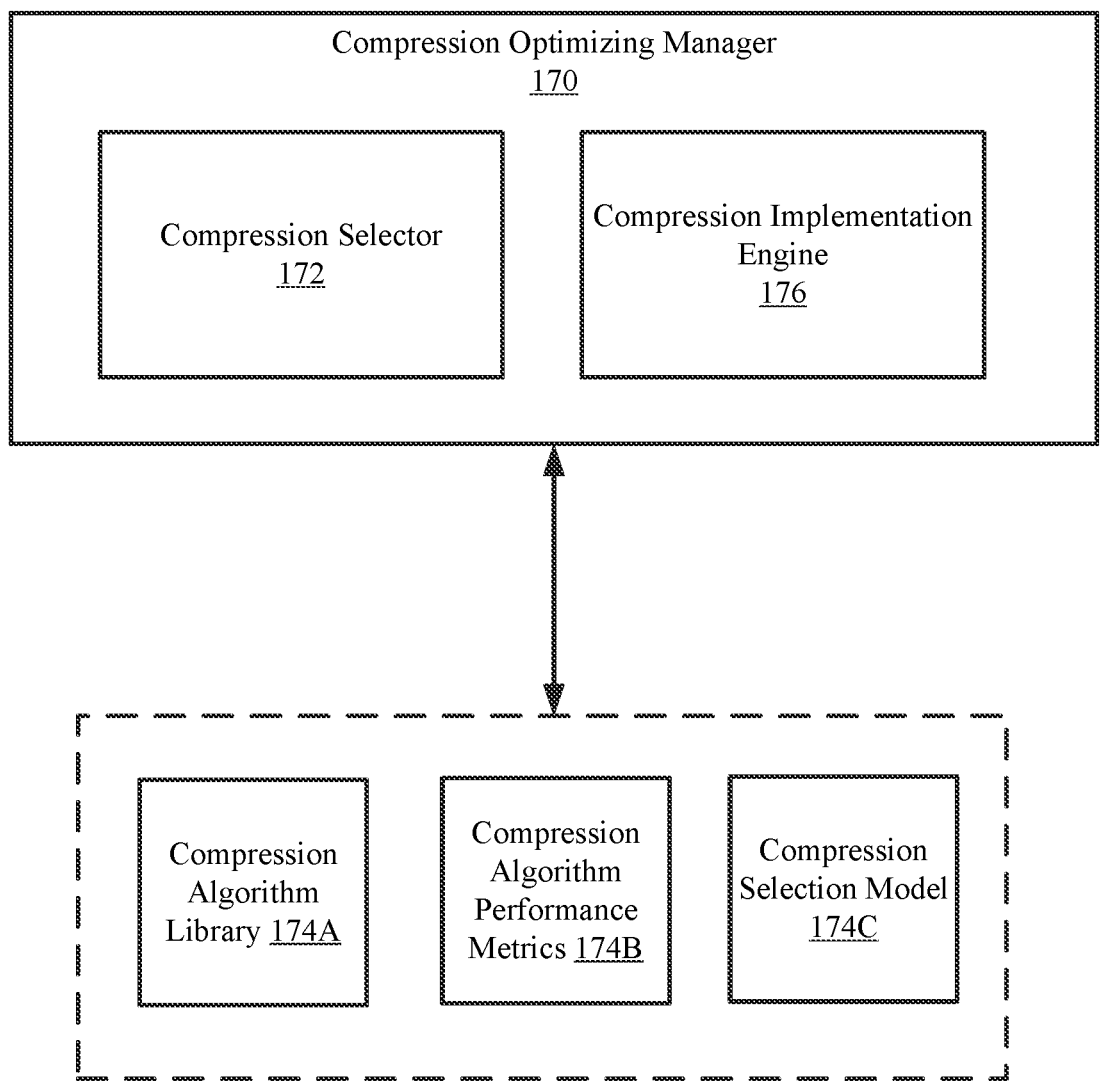
FIG. 1B shows a diagram of a compression optimizing manager in accordance with one or more embodiments of the invention.

FIG. 1B shows a diagram of a compression optimizing manager (170). The compression optimizing manager (170) may be an embodiment of the compression optimizing manager (114) discussed above. As discussed above, the compression optimizing manager (170) may obtain backups of applications to be stored in a file system storage devices. To perform the aforementioned functionality, the compression optimizing manager (170) may include a compression selector (172) and a compression implementation engine (176). The compression optimizing manager (170) may include additional, fewer, and/or different components without departing from the invention. Each of the aforementioned components of the compression optimizing manager (170) illustrated in FIG. 1B is discussed below.

In one or more embodiments of the invention, the compression selector (172) includes functionality for generating a compression selection model (174C) (discussed below) in accordance with FIG. 2A. Further, the compression selector (172) includes functionality for selecting a compression algorithm using the compression selection model (174C) in accordance with FIG. 2B. The compression selection may be performed using production host objectives (174A) (discussed below).

In one or more embodiments of the invention, the compression selector (172) is a physical device. The physical device may include circuitry. The physical device may be, for example, a field-programmable gate array, application specific integrated circuit, programmable processor, microcontroller, digital signal processor, or other hardware processor. The physical device may be adapted to provide the functionality of the compression optimizing manager (170) described throughout this application.

Figure 2A:
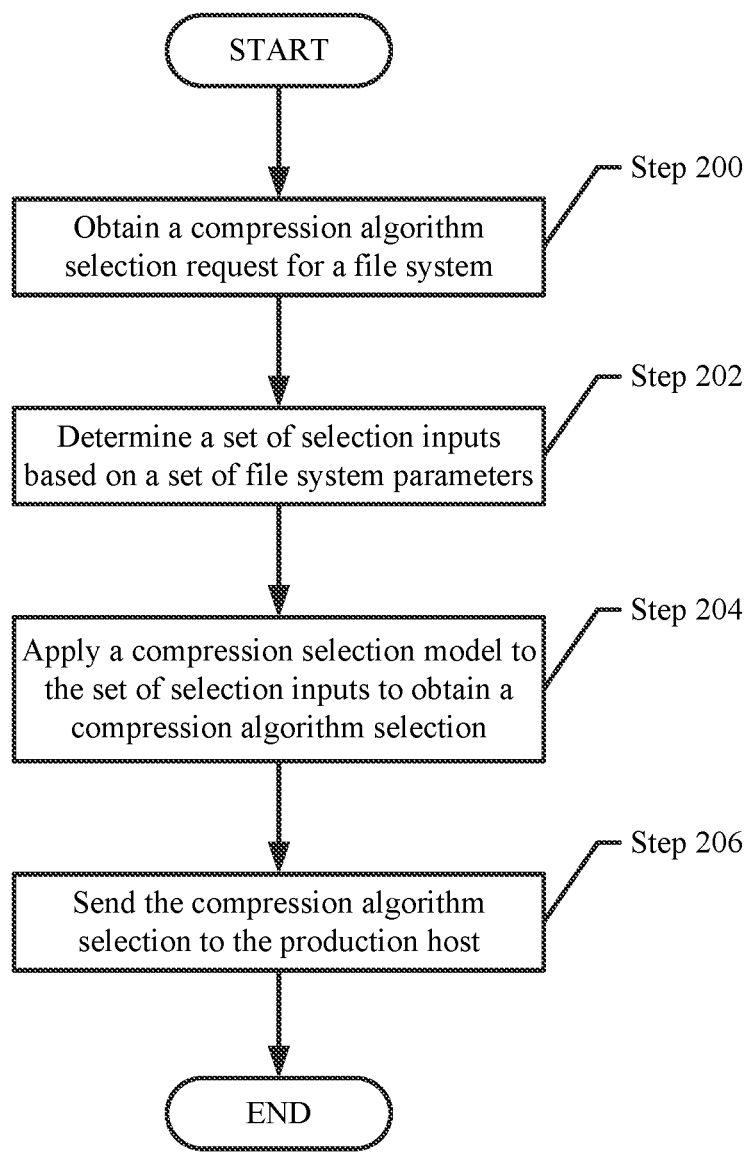
FIG. 2A shows a flowchart for a method for generating a compression selection model in accordance with one or more embodiments of the invention.

In one or more of embodiments of the invention, the compression selector (172) is implemented as computer instructions, e.g., computer code, stored on a persistent storage that when executed by a processor of the compression optimizing manager (170) cause the compression optimizing manager (170) to provide the functionality of the compression selector (172) described throughout this application and/or all, or a portion thereof, of the method illustrated in FIG. 2A.

In one or more embodiments of the invention, the compression implementation engine (176) includes functionality for implementing the compression of file system data using the selected compression algorithm. The selected compression algorithm may be lossless or lossy without departing from the invention. The compression implementation engine (176) may perform the compression in accordance with FIG. 2B.

In one or more embodiments of the invention, the compression implementation engine (176) is a physical device. The physical device may include circuitry. The physical device may be, for example, a field-programmable gate array, application specific integrated circuit, programmable processor, microcontroller, digital signal processor, or other hardware processor. The physical device may be adapted to provide the functionality of the compression implementation engine (176) described throughout this application.

Figure 2B:
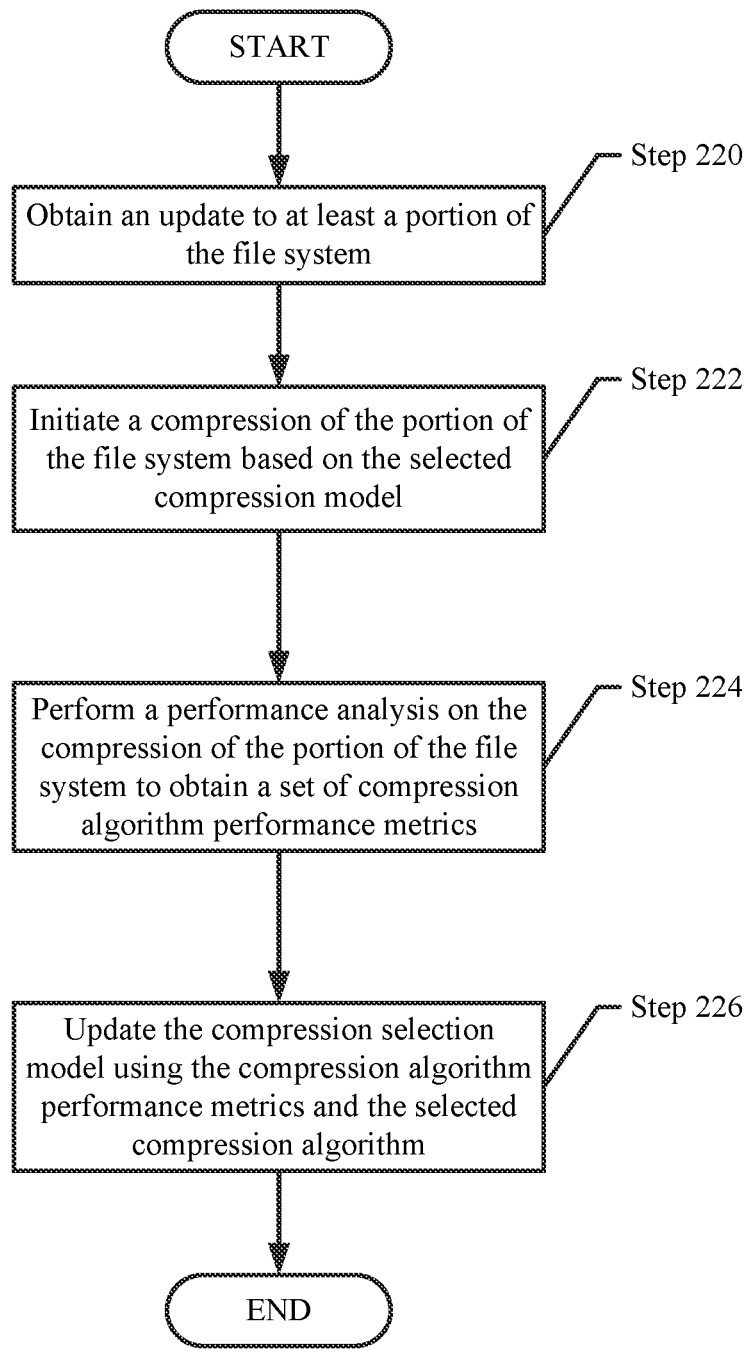
FIG. 2B shows a flowchart for selecting a compression algorithm in accordance with one or more embodiments of the invention.

In one or of embodiments of the invention, the compression implementation engine (176) is implemented as computer instructions, e.g., computer code, stored on a persistent storage that when executed by a processor of the compression optimizing manager (170) cause the compression optimizing manager (170) to provide the functionality of the compression implementation engine (176) described throughout this application and/or all, or a portion thereof, of the method illustrated in FIG. 2B.

In one or more embodiments of the invention, the compression optimization manager (170) may access data structures such as, for example: a compression algorithm library (174A), compression algorithm performance metrics (174B), and a compression selection model (174C). The compression optimization manager (170) may access additional, fewer, and/or different data structures without departing from the invention. The aforementioned data structures may be stored in memory of a production host (e.g., 110A, 110M, FIG. 1A) discussed above. Alternatively, the aforementioned data structures may be stored in the persistent storage (e.g., 116, FIG. 1A) of a production host (e.g., 110A, 110M, FIG. 1A) discussed above. Each of the aforementioned data structures illustrated in FIG. 1B is discussed below.

In one or more embodiments of the invention, the compression algorithm library (174A) is a data structure that specifies the compression algorithms to potentially choose from for implementation on the file system. The compression algorithm library (174A) may further specify a set of file system parameters (further discussed in FIG. 2A) for which a compression algorithm is highly suited. The compression algorithm library (174A) may be updated as the compression implementation engine (176) is updated to be equipped to perform the compression algorithms.

In one or more embodiments of the invention, the compression algorithm performance metrics (174B) (also referred to as "training compression algorithm performance metrics") are data structures that specify the performance metrics of one or more compression algorithms. Specifically, the compression algorithm performance metrics (174) may specify entries that each specify a compression algorithm (e.g., via a compression algorithm identifier) and the associated performance metrics of the corresponding compression algorithm. The compression algorithm performance metrics (174B) may be generated in accordance with FIG. 2A.

In one or more embodiments of the invention, the entries in the compression algorithm performance metrics (174B) further specify the file system parameters (further discussed in FIG. 2A) for which the corresponding compression algorithm is optimally suited for. Such specified file system parameters may be used to generate the compression selection model (174C).

In one or more embodiments of the invention, the compression selection model (174C) is a data structure that associates the various weightages of one or more performance metrics to an optimal compression algorithm. For example, the compression selection model (174C) may be a function that takes as inputs preferences of performance metrics (e.g., performance objectives), and produces an output of a selected compression algorithm. The compression selection model (174C) may be generated in accordance with FIG. 2A.

In one or more embodiments of the invention, the compression selection model (174C) is generated using a machine learning algorithm. In one or more embodiments of the invention, a machine learning algorithm is an algorithm that includes processing training data to produce a machine learning model (e.g., the compression selection algorithm (174C). The training data may associate a compression algorithm in the compression algorithm library (174A) to a set of file system parameters. A compression algorithm identifier for each compression algorithm and their corresponding file system parameters are processed using the machine learning algorithm such that the result is the compression selection model (174C) that takes as an input a set of file system parameters (also referred to as a set of selection inputs) and generating, as an output, a compression algorithm Examples of machine learning algorithms include, but are not limited to: linear regression, multi-linear regression, logistic regression, decision tree, and gradient boosting machine (GBM).

FIGS. 2A-2B show flowcharts in accordance with one or more embodiments of the invention. While the various steps in the flowchart are presented and described sequentially, one of ordinary skill in the relevant art will appreciate that some or all of the steps may be executed in different orders, may be combined or omitted, and some or all steps may be executed in parallel. In one embodiment of the invention, the steps shown in FIGS. 2A-2B may be performed in parallel with any other steps shown in FIGS. 2A-2B without departing from the scope of the invention.

FIG. 2A shows a flowchart for selecting a compression algorithm in accordance with one or more embodiments of the invention. The method shown in FIG. 2A may be performed by, for example, a compression optimizing manager (114, FIG. 1B). Other components of the system illustrated in FIG. 1A or FIG. 1B may perform the method of FIG. 2A without departing from the invention.

Turning to FIG. 2A, in step 200, a compression algorithm selection request is obtained from a client or any other entity for a file system managed by a production host. The compression algorithm selection request may specify performing a selection of a compression algorithm for the file system. The compression algorithm selection request may further specify a set of preferred file system parameters to be evaluated for the compression algorithm selection.

In one or more embodiments of the invention, a file system parameter is a characteristic of the file system that may be used to determine an optimal compression selection algorithm Examples of file system parameters include, but are not limited to: a type of production host, a file size, a file format, a number of files in the file system, and a backup storage type. Additional examples of file system attributes include, but are not limited to: a file system protocol of the file system, a target destination of the compressed file system, a geographical location of the production host implementing the file system, and a geographical location of the target storage device in which the compressed file system is to be stored. For example, the file system protocol may be a server message block (SMB) protocol, network file system (NFS), Hadoop distributed file system (HDFS), or a simple storage system (S3) protocol.

In step 202, a set of selection inputs are determined based on a set of file system parameters. In one or more embodiments of the invention, the set of selection inputs are determined based on the preferred file system parameters. As discussed above, the preferred file system parameters may be specified in the compression algorithm selection request. In such embodiments, the set of selection inputs include the specified preferred file system parameters. For example, the compression algorithm selection request may specify that the file system protocol and the geographical location of the production host are preferred file system parameters. In such example, the file system protocol and the geographical location of the target storage device may comprise the set of selection inputs.

In one or more embodiments of the invention, the preferred file system parameters are not specified in the compression algorithm selection request. In such embodiments, the selection inputs are determined by sending a request to the client, or other entity sending the compression algorithm selection request. The request may specify obtaining preferred file system parameters.

In one or more embodiments of the invention, the set of selection inputs are determined by analyzing the file system parameters to determine a uniqueness of each file system parameter. Any file system parameters that exceed a uniqueness threshold may be included in the selection inputs. In one or more embodiments of the invention, a uniqueness threshold is a value of a uniqueness that is used to determine a uniqueness of a file system parameter. The uniqueness may be determined by comparing the file system parameters to other file systems. For example, the uniqueness may be a high value for file system parameters that are very unique to a file system relative to the other file systems in a production host environment. The other file system parameters may be stored by the compression algorithm optimization manager.

In step 204, a compression selection model is applied to the determined set of selection inputs to obtain a compression algorithm selection. In one or more embodiments of the invention, the set of selection inputs are input into the compression selection model. The output of the compression selection model is an optimal compression algorithm. The optimal compression algorithm is the compression algorithm selection.

In step 206, the compression algorithm selection is sent to the production host. In one or more embodiments of the invention, the compression algorithm selection is sent to the production host using the data agent. The data agent, via a production host interface, sends an identifier of the compression algorithm selection to the production host.

FIG. 2B shows a flowchart for implementing a compression on a file system in accordance with one or more embodiments of the invention. The method shown in FIG. 2A may be performed by, for example, a compression optimizing manager (114, FIG. 1B). Other components of the system illustrated in FIG. 1A or FIG. 1B may perform the method of FIG. 2B without departing from the invention.

In step 220, an update to a portion of the file system is obtained. The update may include a file being updated, a new file added, a file being removed, a new directory introduced to the root path. Other updates may be obtained without departing from the invention.

In step 222, a compression of the updated portion of the file system is initiated based on the selected compression model. In one or more embodiments of the invention, the compression is performed in accordance with the selected compression algorithm.

In step 224, a performance analysis is performed on the compression algorithm of the portion of the file system to obtain a set of compression algorithm performance metrics. In one or more embodiments of the invention, the performance analysis includes measuring metrics of the compression algorithm on the portion of the file system. The measurements may include, for example, a compression time, a compression ratio (e.g., a ratio of original data to compressed data), a measurement of data loss (if the compression algorithm is a lossy compression algorithm), and/or any other measurement of the compression algorithm on the file system without departing from the invention.

In step 226, the compression selection model is updated using the compression algorithm performance metrics and the selection compression algorithm. In one or more embodiments of the invention, the compression selection model is updated by further retraining the model based on the performance analysis. Specifically, the compression algorithm performance metrics are included in the training data, and a retraining of the model is performed.

Example

Figure 3A:
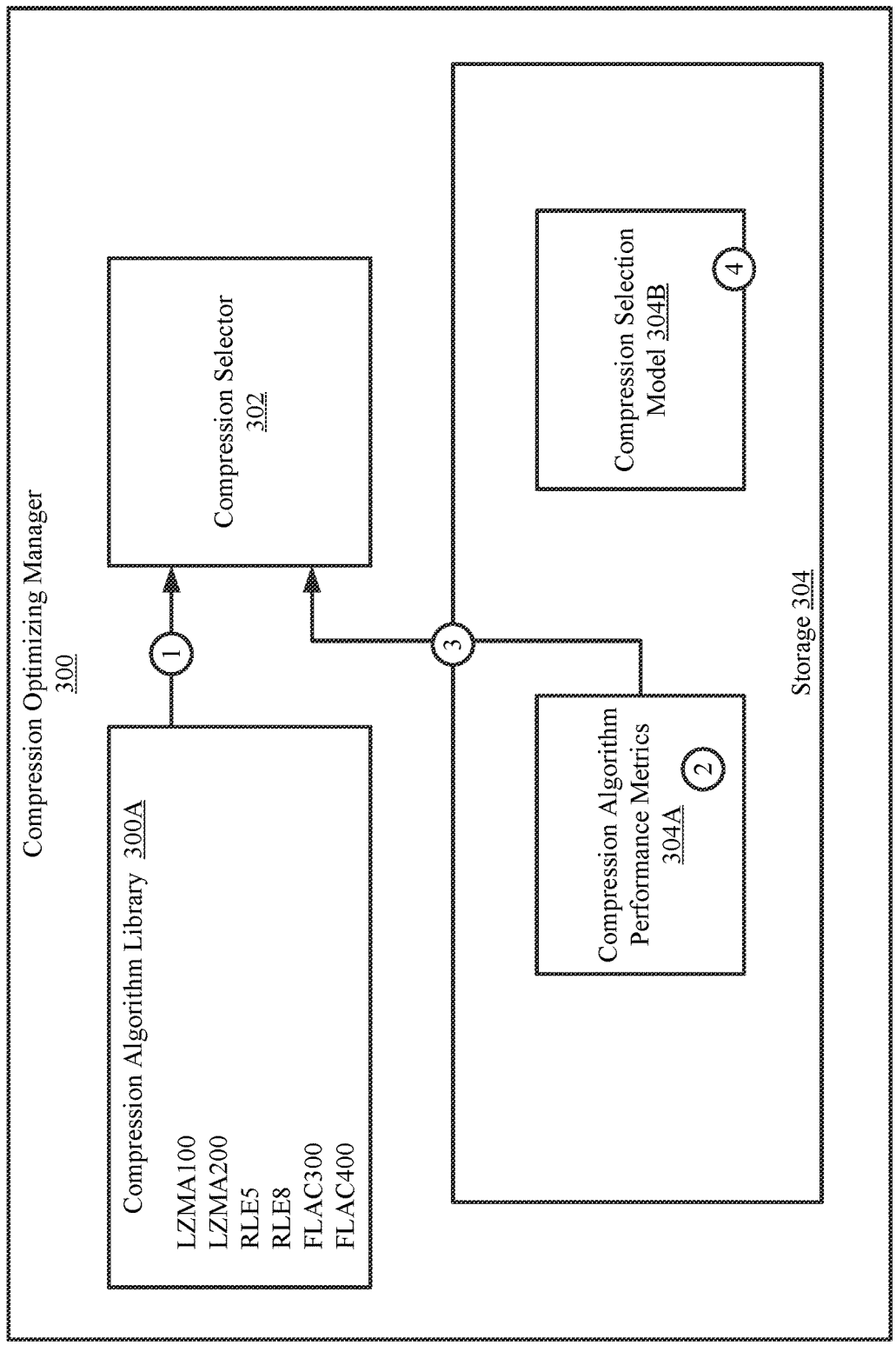
FIGS. 3A-3B show an example in accordance with one or more embodiments of the invention.
Figure 3B:
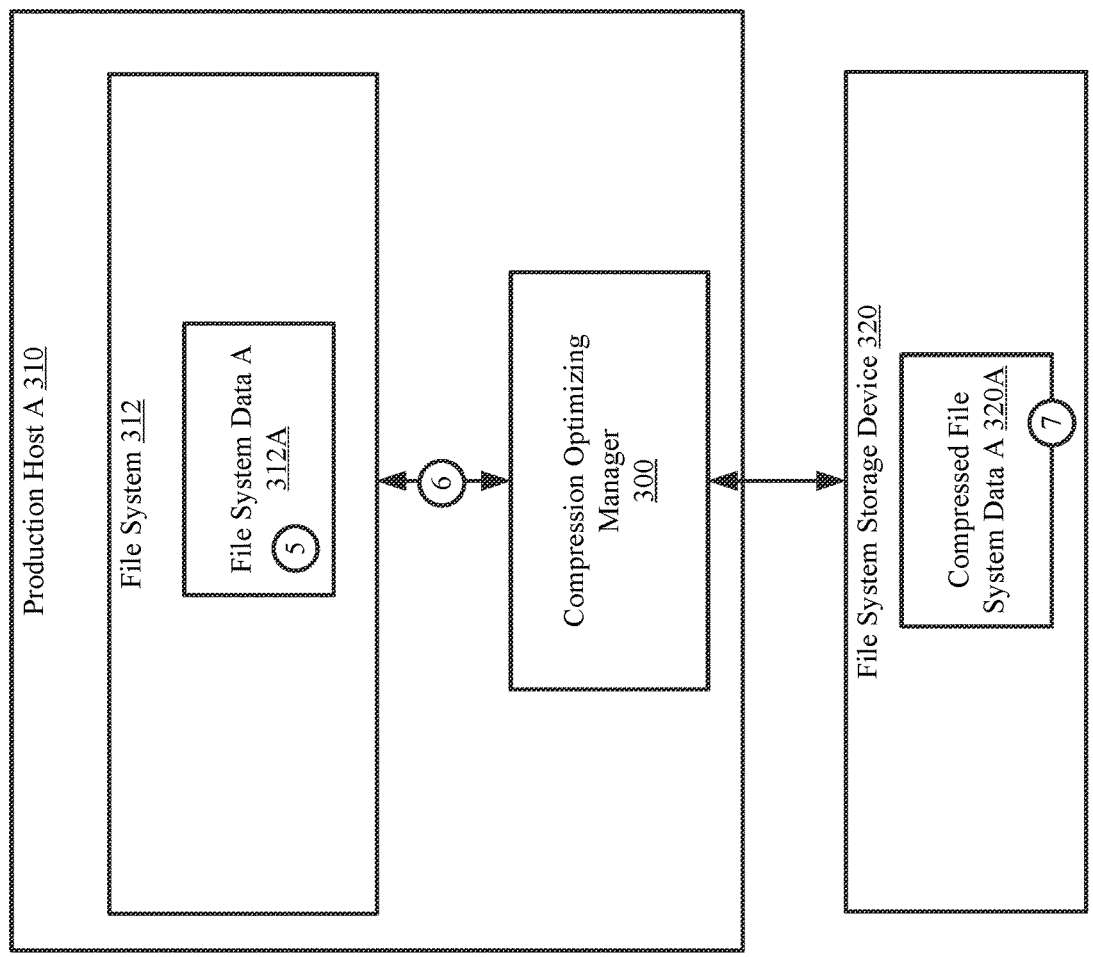

The following section describes an example. The example, illustrated in FIGS. 3A-3B, is not intended to limit the invention. Turning to the example, FIG. 3A shows a diagram of an example system. The example system includes a compression optimizing manager (300). For the sake of brevity, not all components of the example system are illustrated in FIG. 3A.

Turning to FIG. 3A, the compression optimizing manager (300) generates a compression selection model (304B). Specifically, the compression selector (302) obtains a set of compression algorithms (300A) [1]. The set of compression algorithms (300A) includes variations of LZMA, RLE, and FLAC. Each compression algorithm, or variation thereof, performs the compression with varying performance metrics.

The compression selector (302) generates training compression algorithm performance metrics (304A) by executing each compression algorithm in the set of compression algorithms (300A) on a training file system (not shown) and measuring the compression ratios, the compression times, and decompression times for each compression algorithm implemented on each data object. The compression algorithm performance metrics (304A) specify: (i) the compression algorithms, (ii) the performance metrics of each compression algorithm associated with each data object, and (iii) file system parameters corresponding to the file system such as number of files, average file size, most common file extension of the files in the file system, and operating system in which the file system operates. The compression algorithm performance metrics (304A) are stored in storage (304) of the compression optimizing manager (300) [2].

The compression selector (302) obtains the compression algorithm performance metrics (304A) and applies a machine learning algorithm on the compression algorithm performance metrics (304A) [3]. The result of applying the machine learning algorithm is the generation of the compression selection model (304B) [4]. The compression selection model (304B), in this example, obtains as inputs a set of preferred file system parameters. The output of the compression selection model (304B) is a selected compression algorithm that is best determined to perform the compression of the file system.

FIG. 3B shows a second diagram of the example system. For the sake of brevity, not all components of the example system are illustrated in FIG. 3B. As illustrated in FIG. 3B, the example system further includes a production host (310) in which the file system (312) and the compression optimizing manager (300) operate. At a later point in time, the file system (312) undergoes an update [5]. The update includes introducing a new set of files in the file system data (312A). The new set of files increases the total number of files for the file system from 40 files to 800 files.

Based on the increase in file numbers in the file system (312), the compression optimizing manager (300) inputs the file system parameter (e.g., the number of files) as a selection input in accordance with FIG. 2A to identify a compression algorithm optimized to perform a file system compression on a file system (312) with a high number of files [6]. Following the selection of the compression algorithm, the compression optimizing manager (300) performs the method of FIG. 2B to detect the change in the file system (312) and performs a compression of the file system (312) using the selected compression algorithm. The result is a compressed file system data (320A) stored in a file system storage device (320) [7]. The compressed file system data (320A) may be accessed when accessing the file system (312).

End of Example

As discussed above, embodiments of the invention may be implemented using computing devices. FIG. 4 shows a diagram of a computing device in accordance with one or more embodiments of the invention. The computing device (400) may include one or more computer processors (402), non-persistent storage (404) (e.g., volatile memory, such as random access memory (RAM), cache memory), persistent storage (406) (e.g., a hard disk, an optical drive such as a compact disk (CD) drive or digital versatile disk (DVD) drive, a flash memory, etc.), a communication interface (412) (e.g., Bluetooth interface, infrared interface, network interface, optical interface, etc.), input devices (410), output devices (408), and numerous other elements (not shown) and functionalities. Each of these components is described below.

In one embodiment of the invention, the computer processor(s) (402) may be an integrated circuit for processing instructions. For example, the computer processor(s) may be one or more cores or micro-cores of a processor. The computing device (400) may also include one or more input devices (410), such as a touchscreen, keyboard, mouse, microphone, touchpad, electronic pen, or any other type of input device. Further, the communication interface (412) may include an integrated circuit for connecting the computing device (400) to a network (not shown) (e.g., a local area network (LAN), a wide area network (WAN) such as the Internet, mobile network, or any other type of network) and/or to another device, such as another computing device.

In one embodiment of the invention, the computing device (400) may include one or more output devices (408), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (402), non-persistent storage (404), and persistent storage (406). Many different types of computing devices exist, and the aforementioned input and output device(s) may take other forms.

One or more embodiments of the invention may be implemented using instructions executed by one or more processors of the data management device. Further, such instructions may correspond to computer readable instructions that are stored on one or more non-transitory computer readable mediums.

Embodiments of the invention may improve the efficiency of storing and processing data. Specifically, embodiments of the invention enable selection of an optimal compression algorithm that is tailored to the preferences of clients managing a file system (or tailored to the optimization of the compression of said file system). Embodiments of the invention reduce the cognitive burden applied to a user to determine the optimal compression algorithm. Further, by selecting the optimal compression algorithm, embodiments enable the storage of the compressed file system to meet their respective performance objectives. Further, embodiments of the invention relate to reducing the storage usage of files and/or file data generated by applications utilizing the file system. By performing the compression while meeting the performance objectives of the production environment, embodiments of the invention improve the efficiency of the combination of: (i) the compression of the data, (ii) the minimizing of storage space use, and (iii) the operation of the production environment.

Thus, embodiments of the invention may address the problem of inefficient use of computing resources. This problem arises due to the technological nature of the environment in which production hosts are utilized.

The problems discussed above should be understood as being examples of problems solved by embodiments of the invention disclosed herein and the invention should not be limited to solving the same/similar problems. The disclosed invention is broadly applicable to address a range of problems beyond those discussed herein.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A method for managing a file system, the method comprising:
    obtaining, by a compression optimizing manager, a compression algorithm selection request for the file system;
    determining a set of selection inputs based on a set of file system parameters of the file system,
        wherein determining the set of selection inputs comprises:
            performing a file system parameter analysis to determine a uniqueness of each of the set of file system parameters of the file system relative to other file systems;
            making a determination that a portion of the set of file system parameters of the file system exceeds a uniqueness threshold, and
            based on the determination: assigning the portion of the set of file system parameters of the file system to the set of selection inputs,
        wherein the set of selection inputs comprise a subset of the file system parameters preferred for evaluation, and
        wherein the set of file system parameters comprises: a file system protocol of the file system, a geographical location of a production host implementing the file system, and a geographical location of a target storage device in which the file system is to be stored after compression;
    applying a compression selection model to the set of selection inputs to obtain a compression algorithm selection; and
    initiating a file system compression implementation of the file system using the compression algorithm selection.

2. The method of claim 1, further comprising:
    prior to obtaining the compression algorithm selection request:
        identifying a set of compression algorithms;
        identifying the set of file system parameters of the file system;
        obtaining a training file system;
        performing a compression algorithm analysis on each compression algorithm in the set of compression algorithms using the training file system to obtain a set of training compression algorithm performance metrics; and
        generating the compression selection model using the set of training compression algorithm performance metrics and the set of file system parameters of the file system.

3. The method of claim 2, wherein the set of file system parameters of the file system further comprises at least one of: a type of the production host, a file size, a file format, a number of files in the file system, and a backup storage type.

4. The method of claim 1, wherein determining the set of selection inputs comprises:
    sending the set of file system parameters to a client; and
    obtaining a response that specifies the set of selection inputs.

5. The method of claim 1, wherein determining the set of selection inputs comprises:
    sending a selection request to a client that specifies selecting at least a portion of the set of file system parameters of the file system;
    obtaining a response based on the selection request that specifies the portion of the set of file system parameters of the file system; and
    based on the response, assigning the portion of the set of file system parameters of the file system to the set of selection inputs.

6. The method of claim 1, further comprising:
    after initiating the file system compression implementation:
    obtaining an update to a portion of the file system;
    initiating a compression of the portion of the file system using the compression algorithm selection;
    performing a performance analysis on the compression of the portion of the file system to obtain a set of compression algorithm performance metrics; and
    updating the compression selection model using the set of compression algorithm performance metrics and the compression algorithm selection.

7. A non-transitory computer readable medium comprising computer readable program code, which when executed by a computer processor enables the computer processor to perform a method for managing the file system, the method comprising:
    obtaining, by a compression optimizing manager, a compression algorithm selection request for the file system;
    determining a set of selection inputs based on a set of file system parameters of the file system,
        wherein determining the set of selection inputs comprises:
            performing a file system parameter analysis to determine a uniqueness of each of the set of file system parameters of the file system relative to other file systems;
            making a determination that a portion of the set of file system parameters of the file system exceeds a uniqueness threshold; and
        based on the determination: assigning the portion of the set of file system parameters of the file system to the set of selection inputs, wherein the set of selection inputs comprise a subset of the file system parameters preferred for evaluation, and wherein the set of file system parameters comprises: a file system protocol of the file system, a geographical location of a production host implementing the file system, and a geographical location of a target storage device in which the file system is to be stored after compression;

applying a compression selection model to the set of selection inputs to obtain a compression algorithm selection; and initiating a file system compression implementation of the file system using the compression algorithm selection.

8. The non-transitory computer readable medium of claim 7, further comprising:

prior to obtaining the compression algorithm selection request:

identifying a set of compression algorithms;

identifying the set of file system parameters of the file system;

obtaining a training file system;

performing a compression algorithm analysis on each compression algorithm in the set of compression algorithms using the training file system to obtain a set of training compression algorithm performance metrics; and generating the compression selection model using the set of training compression algorithm performance metrics and the set of file system parameters of the file system.

9. The non-transitory computer readable medium of claim 8, wherein the file system parameters further comprises at least one of: a type of the production host, a file size, a file format, a number of files in the file system, and a backup storage type.

10. The non-transitory computer readable medium of claim 7, wherein determining the set of selection inputs comprises:

sending the set of file system parameters to a client; and
obtaining a response that specifies the set of selection inputs.

11. The non-transitory computer readable medium of claim 7, wherein determining the set of selection inputs comprises:

performing a file system parameter analysis to determine a uniqueness of each of the set of file system parameters of the file system;

making a determination that a portion of the file system parameters exceeds a uniqueness threshold; and based on the determination: assigning the portion of the set of file system parameters of the file system to the set of selection inputs.

12. The non-transitory computer readable medium of claim 7, further comprising:

after initiating the file system compression implementation:

obtaining an update to a portion of the file system;

initiating a compression of the portion of the file system using the compression algorithm selection;

performing a performance analysis on the compression of the portion of the file system to obtain a set of compression algorithm performance metrics; and updating the compression selection model using the set of compression algorithm performance metrics and the compression algorithm selection.

13. A system comprising:
a processor; and memory comprising instructions, which when executed by the processor, perform a method comprising:

obtaining, by a compression optimizing manager, a compression algorithm selection request for the file system;

determining a set of selection inputs based on a set of file system parameters of the file system, wherein determining the set of selection inputs comprises:

performing a file system parameter analysis to determine a uniqueness of each of the set of file system parameters of the file system relative to other file systems;

making a determination that a portion of the set of file system parameters of the file system exceeds a uniqueness threshold; and based on the determination: assigning the portion of the set of file system parameters of the file system to the set of selection inputs, wherein the set of selection inputs comprise a subset of the file system parameters preferred for evaluation, and wherein the set of file system parameters comprises: a file system protocol of the file system, a geographical location of a production host implementing the file system, and a geographical location of a target storage device in which the file system is to be stored after compression;

applying a compression selection model to the set of selection inputs to obtain a compression algorithm selection; and initiating a file system compression implementation of the file system using the compression algorithm selection.

14. The system of claim 13, further comprising:

prior to obtaining the compression algorithm selection request:

identifying a set of compression algorithms;

identifying the set of file system parameters of the file system;

obtaining a training file system;

performing a compression algorithm analysis on each compression algorithm in the set of compression algorithms using the training file system to obtain a set of training compression algorithm performance metrics; and generating the compression selection model using the set of training compression algorithm performance metrics and the set of file system parameters of the file system.

15. The system of claim 14, wherein the set of file system parameters of the file system further comprises at least one of: a type of the production host, a file size, a file format, a number of files in the file system, and a backup storage type.

16. The system of claim 13, wherein determining the set of selection inputs comprises:

sending the set of file system parameters to a client; and
obtaining a response that specifies the set of selection inputs.

17. The system of claim 13, wherein determining the set of selection inputs comprises:

performing a file system parameter analysis to determine a uniqueness of each of the set of file system parameters of the file system;

making a determination that a portion of the file system parameters exceeds a uniqueness threshold; and based on the determination: assigning the portion of the set of file system parameters of the file system to the set of selection inputs.

* * * * *